(12) United States Patent
Mostafazadeh et al.

(10) Patent No.: US 7,468,288 B1
(45) Date of Patent: Dec. 23, 2008

(54) DIE-LEVEL OPTO-ELECTRONIC DEVICE AND METHOD OF MAKING SAME

(75) Inventors: Shahram Mostafazadeh, Santa Clara, CA (US); Joseph O. Smith, Morgan Hill, CA (US)

(73) Assignee: National Semiconductor Corporation, Santa Clara, CA (US)

(*) Notice: Subject to any disclaimer, the term of this patent is extended or adjusted under 35 U.S.C. 154(b) by 80 days.

(21) Appl. No.: 11/481,699

(22) Filed: Jul. 5, 2006

Related U.S. Application Data

(62) Division of application No. 10/650,215, filed on Aug. 27, 2003, now Pat. No. 7,098,518.

(51) Int. Cl.
*H01L 21/00* (2006.01)
*H01L 21/44* (2006.01)

(52) U.S. Cl. ............... 438/51; 438/25; 438/64; 438/613; 257/E25.032

(58) Field of Classification Search ............ 438/24, 438/27, 48, 64, 613, 51, 25; 257/88, 433, 257/E25.032
See application file for complete search history.

(56) References Cited

U.S. PATENT DOCUMENTS

| | | | |
|---|---|---|---|
| 5,621,225 A | 4/1997 | Shieh et al. | |
| 6,322,903 B1 | 11/2001 | Siniaguine et al. | |
| 6,498,381 B2 | 12/2002 | Halahan et al. | |
| 6,607,941 B2 | 8/2003 | Prabhu et al. | |
| 6,677,235 B1 | 1/2004 | Yegnashankaran et al. | |
| 6,703,689 B2 | 3/2004 | Wada | |
| 6,730,459 B2 | 5/2004 | Nishikawa et al. | |
| 6,759,687 B1 | 7/2004 | Miller et al. | |
| 2003/0193078 A1 | 10/2003 | Chungpaiboonpatana et al. | |
| 2003/0216010 A1* | 11/2003 | Atlas | 438/462 |
| 2003/0230805 A1 | 12/2003 | Noma et al. | |

OTHER PUBLICATIONS

Reche, John, "*Wafer Thinning and Thru-Silicon Vias: The Path to Wafer Level Packaging*", Tru-Si Technologies, IEEE/CPMT Meeting, Santa Clara, CA, May 10, 2000, 42 Pages.
Tru-Si Technologies, "*Thru Silicon Interconnects*", 33 Pages.
Advanced Semiconductor Engineering Korea, Inc., "*CMOS Image Sensor*", http://www.asekr.com/doc/ASE_korea_Image_Sensor_overview.pdf, pp. 4 and 5.

* cited by examiner

*Primary Examiner*—Nitin Parekh
(74) *Attorney, Agent, or Firm*—Beyer Law Group LLP

(57) ABSTRACT

The invention includes a die-level opto-electronic device with a semiconductor die and a photonic device including a conductive structure formed in the die away from the edges of the die. The conductive structure is electrically connected to the photonic device. The device also includes an optically transparent laminate attached to overlay the photonic device. The invention also comprises a semiconductor wafer with a plurality of photonic devices exposed on a first surface and a plurality of conductive structures being exposed on a second surface opposing the first surface. The conductive structures are electrically connected to the photonic devices which are overlaid with an optically transparent laminate. The invention further includes methods of forming die-level opto-electronic devices and semiconductor wafers.

21 Claims, 4 Drawing Sheets

DIE-LEVEL OPTO-ELECTRONIC DEVICE AND METHOD OF MAKING SAME

RELATED APPLICATION

This is a Divisional application of prior U.S. application Ser. No. 10/650,215, entitled "DIE-LEVEL OPTO-ELECTRONIC DEVICE AND METHOD OF MAKING SAME", filed on Aug. 27, 2003 now U.S. Pat. No. 7,098,518, which is incorporated herein by reference and from which priority under 35 U.S.C. § 120 is claimed.

BRIEF DESCRIPTION OF THE INVENTION

This invention relates generally to opto-electronic devices. More specifically, this invention relates to the protection of die-level opto-electronic devices by the application of an optically transparent laminate and the use of a metal feedthrough structure.

BACKGROUND OF THE INVENTION

Current electronic mechanisms such as digital cameras often employ die-level opto-electronic devices to gather and process optical information. Such devices commonly comprise a single semiconductor die with a photonic device, such as a charge coupled device (CCD) or image sensors like complementary metal oxide semiconductor (CMOS) imagers, fabricated on its upper surface. This photonic device is then left optically exposed, where it can sense photonic input. In this manner, photonic devices can read and process visual input, generating digital images without need of lenses or film.

Such opto-electronic devices are, however, not without their drawbacks. The delicate circuitry of a photonic device must be protected from contaminants and damage, yet must also remain optically exposed. It is often preferable to protect these photonic devices from harm by encapsulating them within an optically transparent package. FIG. 1 illustrates a cross-sectional view of a typical leadless chip carrier (LCC) package that is often used to enclose die-level opto-electronic devices. A die 10 containing imaging circuitry is encased within a package 20. The die 10 also contains bond pads 11, and is wirebonded to terminals 21 with wires 12. The package 20 includes an optically transparent panel 22 that protects the die 10 from damage and contamination while still allowing its imaging circuitry to gather photonic input through the panel 22.

While this package 20 has a number of advantages, namely that it protects the die 10 and its delicate imaging circuitry without significantly detracting from its performance, the package 20 also has certain disadvantages. For instance, as the package 20 must leave sufficient space for the wires 12, it can be bulky. Also, because the package 20 offers no protection to the die 10 until the packaging process is complete, the die 10 remains susceptible to damage until then. Specifically, the die 10 and its imaging circuitry can be damaged at any time during wafer handling, dicing, or wirebonding.

It is therefore desirable to fabricate a more compact, die-level opto-electronic device that offers protection to its opto-electronic circuitry prior to encapsulation.

SUMMARY OF THE INVENTION

In one embodiment of the invention, a die-level opto-electronic device comprises a semiconductor die having edges and a photonic device exposed on a first surface. The device includes a conductive structure formed in the die and away from the edges of the die, the conductive structure being exposed on a second surface of the die that opposes the first surface, wherein the conductive structure is electrically connected to the photonic device. The device also includes an optically transparent laminate attached to the first surface so as to overlay the photonic device.

In another embodiment of the invention, a semiconductor wafer comprises a substrate having a plurality of photonic devices exposed on a first surface. A plurality of conductive structures is formed in the substrate, the plurality of structures being exposed on a second surface of the substrate that opposes the first surface, wherein ones of the plurality of structures are electrically connected to associated ones of the plurality of photonic devices. An optically transparent laminate is attached to the first surface so as to overlay the plurality of photonic devices.

Methods of forming the die-level opto-electronic devices and semiconductor wafers of the invention are also described. The various embodiments of the invention yield more compact opto-electronic devices that are more resistant to contamination and damage. The invention also produces these advantages throughout multiple stages of the fabrication process.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

In one embodiment, the present invention includes the use of an optically transparent laminate that covers the die and its opto-electronic circuitry. This laminate protects the circuitry from damage. Because the laminate makes conventional wirebonding difficult, conductive feed-through structures are employed to electrically connect the opto-electronic circuitry to the opposite side of the die. In this manner, the die and its opto-electronic circuitry are protected from harm while still allowing the die to be electrically connected by its bottom surface.

This embodiment of the invention has a number of advantages. First, as mentioned above, the laminate protects the die and its circuitry from damage. Second, because the laminate is relatively thin and in direct contact with the die, the resulting package is much less bulky than prior art packages. Third, application of the laminate at the wafer-level, before dicing, offers additional advantages. Such a wafer-size laminate is relatively easy to apply, and provides both a barrier to contamination and mechanical support during any wafer handling, dicing, and backgrinding/silicon removal processes that may be required.

Figure 1:
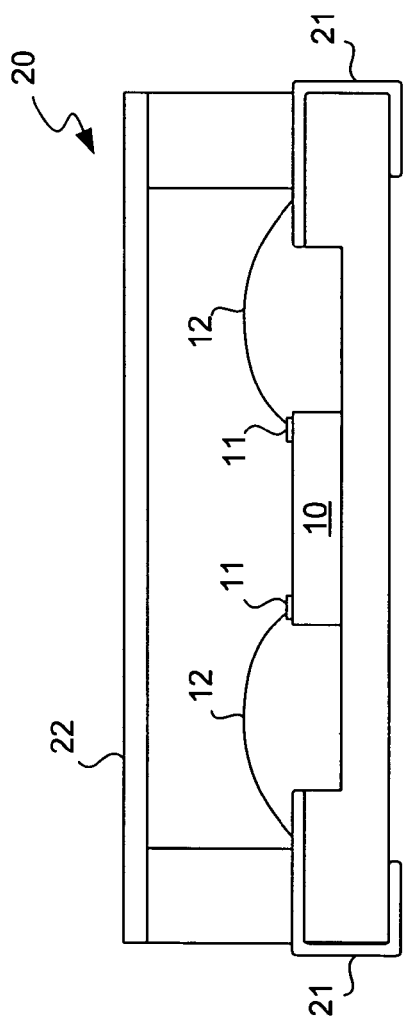
FIG. 1. illustrates a cross-sectional view of an LCC opto-electronic device constructed in accordance with the prior art.
Figure 2:
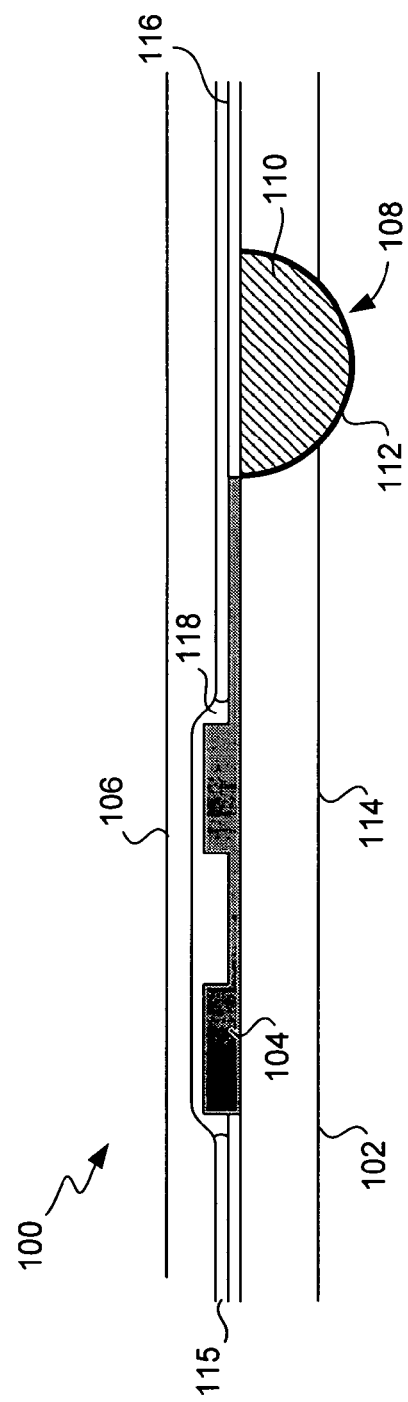
FIG. 2 illustrates a die-level opto-electronic device constructed in accordance with an embodiment of the invention.

FIG. 2 illustrates a die-level opto-electronic device constructed in accordance with an embodiment of the invention. A semiconductor die 100 includes a substrate layer 102, a photonic device 104 that is protected by an optically transparent laminate 106, and a feed-through structure 108. The photonic device 104 can be any opto-electronic sensor, such as a CCD or CMOS sensor. In many prior art devices, bond pads are located on an upper surface 116 of the die 100, meaning that applying a laminate 106 would cover the bond pads and interfere with wirebonding. In contrast, this embodiment of the invention includes a feed-through structure 108 that acts as a conductive via, providing electrical connectivity to the device 104 on a lower surface 114. Such electrical connectivity is provided by a conductive layer 112 that is supported by dielectric material 110. The conductive layer 112 is exposed on the lower surface 114. The device 104 is placed in electronic communication with a lead frame or other electronic components by connecting to the conductive layer 112 of the feed-through structure 108.

The laminate 106 can be applied to the die 100 using known optically transparent adhesives. In certain embodiments, this adhesive can cover a large portion of the die 100, including the photonic device 104, thus firmly securing the laminate 106 to the die 100. Alternatively, the laminate 106 can include recessed cavities 118 which are not adhesively bonded to the die 100. Such cavities allow for the laminate 106 to be bonded to the die 100 while avoiding any risk of the adhesive interfering with the photonic device 104.

Figure 3:
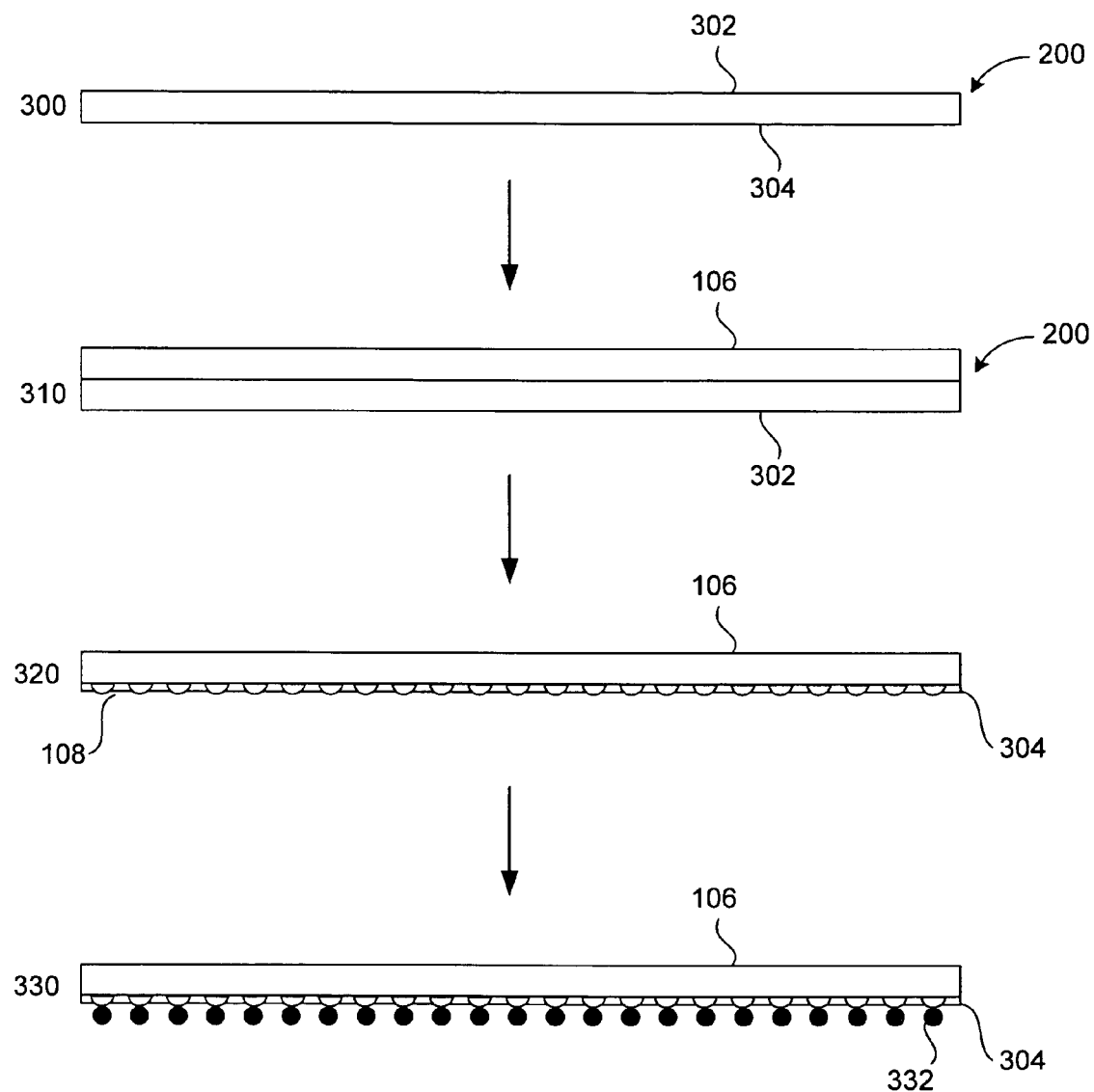
FIG. 3 illustrates process steps to be executed in accordance with an embodiment of the invention.

It is often more efficient to perform as much of the packaging of dies 100 at the wafer level rather than at the level of individual dies 100. To that end, the invention confers the additional advantage of allowing the fabrication of dice 100, complete with their protective laminate 106, at the wafer level. FIG. 3 illustrates process steps to be executed in the fabrication of such a wafer. First, photonic devices 104 and other circuitry are fabricated on the upper surface 302 of a wafer 200 (step 300). At this point, feed-through structures 108 are also fabricated in the wafer 200 so that no portion of the feed-through structures 108 protrudes through the lower surface 304 of the wafer 200. Once this step is complete, a protective laminate 106 is applied to the upper surface 302 of the wafer 200 (step 310). To assist this step, the laminate 106 can include locating features designed for easier and more accurate positioning on the upper surface 302. The lower surface 304 of the wafer 200 is then background, or subjected to one of many other known processes for removing bulk semiconductor material from a wafer 200, such as etching, so as to expose the feed-through structures 108 (step 320).

The feed-through structures 108 are then prepared for connection to other electronic components. Here, solder balls 332 are applied to the feed-through structures 108 (step 330) to produce a configuration similar to a flip chip, where electrical connection to the die 100 is made through electrically conductive elements placed on the lower surface of the die 100. One of skill will realize that the feed-through structures 108 can be electrically connected through other mechanisms besides solder balls 332. For instance, electrical connectivity can be achieved through the use of an under bump metallization (UBM) technique, followed by the application of conductors such as gold stud bumps, polymer bumps, and the like.

Figure 4:
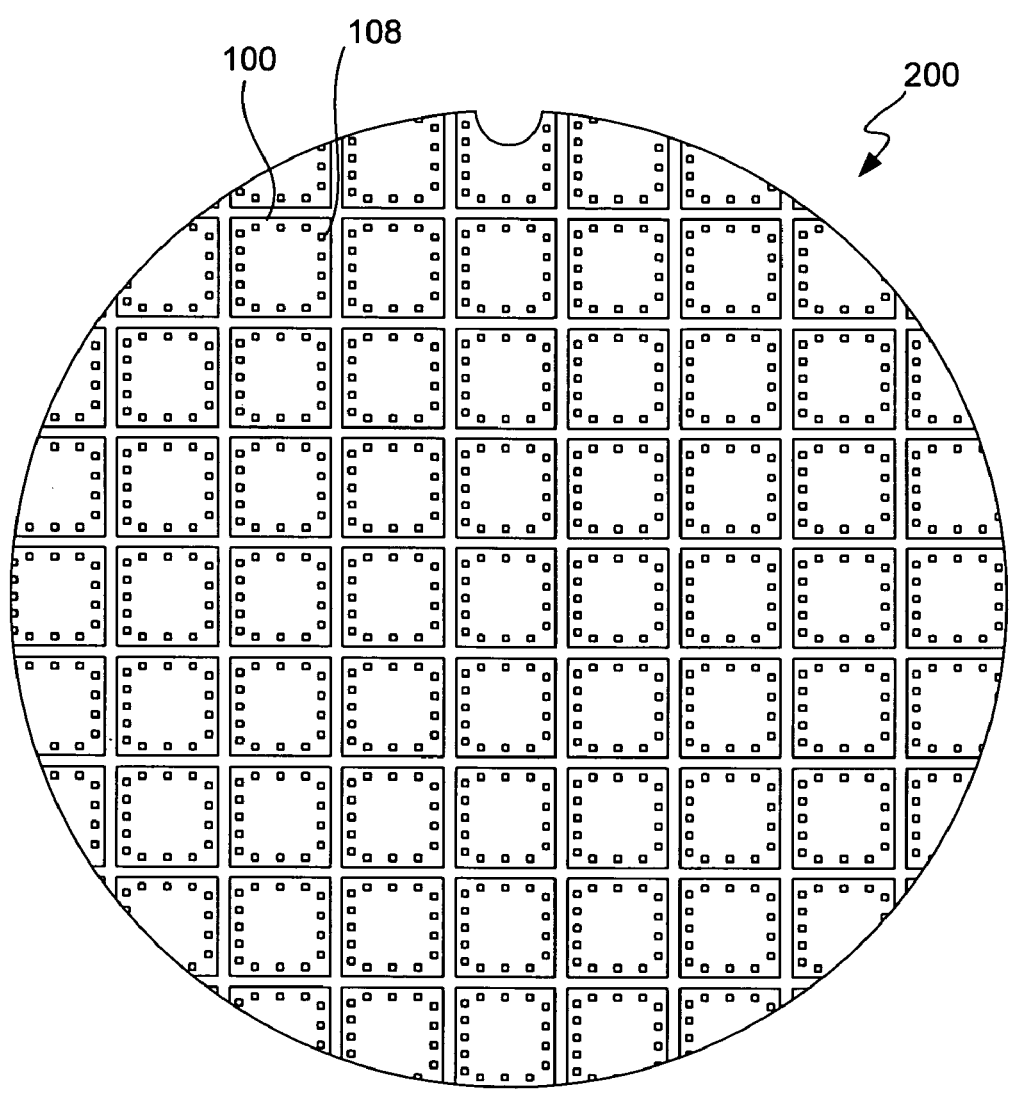
FIG. 4 illustrates a bottom view of a semiconductor wafer constructed in accordance with an embodiment of the invention.

FIG. 4 illustrates a bottom view of the wafer 200 subsequent to step 320, where etching, backgrinding, or some other silicon removal process has exposed the feed-through structures 108. At this point, solder balls 332 or some other conductive bumps can be applied to each feed-through structure 108 to create an array of solder bumps along the edge of each die 100. It should be noted, however, that the invention is not limited to configurations in which conductive material is applied directly to the feed-through structures 108. Rather, known redistribution techniques may be used to create arbitrary arrays of bumps on the lower surface 304. In this manner, feed-through structures 108 can be created in locations convenient to the design of the various circuitry of a die 100, and UBM techniques utilized to redistribute the resulting electrical connections on the lower surface 304 to a configuration more suited to convenient electrical connection of the die 100.

It should also be noted that the silicon removal process of step 320 removes bulk semiconductor material from the lower surface 304 of the wafer 200. In many current processes, silicon removal is made more difficult by the fact that the process tends to remove so much material that the wafer 200 is weakened and susceptible to damage, sometimes during the removal process itself. Such weakening highlights another advantage of the invention, namely that the addition of a laminate 106 structurally reinforces the wafer 200, preventing damage from the silicon removal process. In addition, the laminate 106 helps prevent contamination of opto-electronic circuitry due to chemical and/or particulate matter generated during silicon removal.

Attention now turns to the fabrication of feed-through structures 108. As mentioned above, the feed-through structures 108 are simply conductive structures that allow the die 100 to be connected through its lower surface 114, rather than an upper surface 116, as is typical. The fabrication of feed-through structures 108 is described in more detail in co-pending U.S. application Ser. Nos. 10/004,977, filed on Dec. 3, 2001, and 10/044,805, filed on Jan. 11, 2002, both of which are incorporated herein by reference. It should be noted, however, that the invention is not limited to feed-through structures 108 that have the exact configurations, or that are fabricated using the same methods, as those described therein. Rather, the invention also includes the generation of feed-through structures according to known methods such as laser drilling, and the Atmospheric Downstream Plasma technology used by Tru-Si Technologies.

In general, the abovementioned methods act to fabricate feed-through structures 108 by creating holes in the upper surface 302 of a wafer 200. Again, numerous techniques for creating such holes are contemplated. Typically, these holes do not extend completely through the wafer 200. The holes are then filled with a conductive material along with any barrier layers, insulating layers, and/or dielectric filler layers that may be necessary. Once the feed-through structure 108 is fabricated, the lower surface 304 is background, etched, or subjected to some other silicon removal process to expose a conductive portion of the feed-through structure 108.

It should be noted that the methods of the invention allow for the creation of feed-through structures 108 through the body of the wafer 200. More specifically, such feed-through structures 108 can be created away from the edges of the die. This allows for additional flexibility in the design of semiconductor dies 100, in that the feed-through structures 108 may be placed at any convenient location in the die 100, instead of only at certain restricted locations.

Figure 5A:
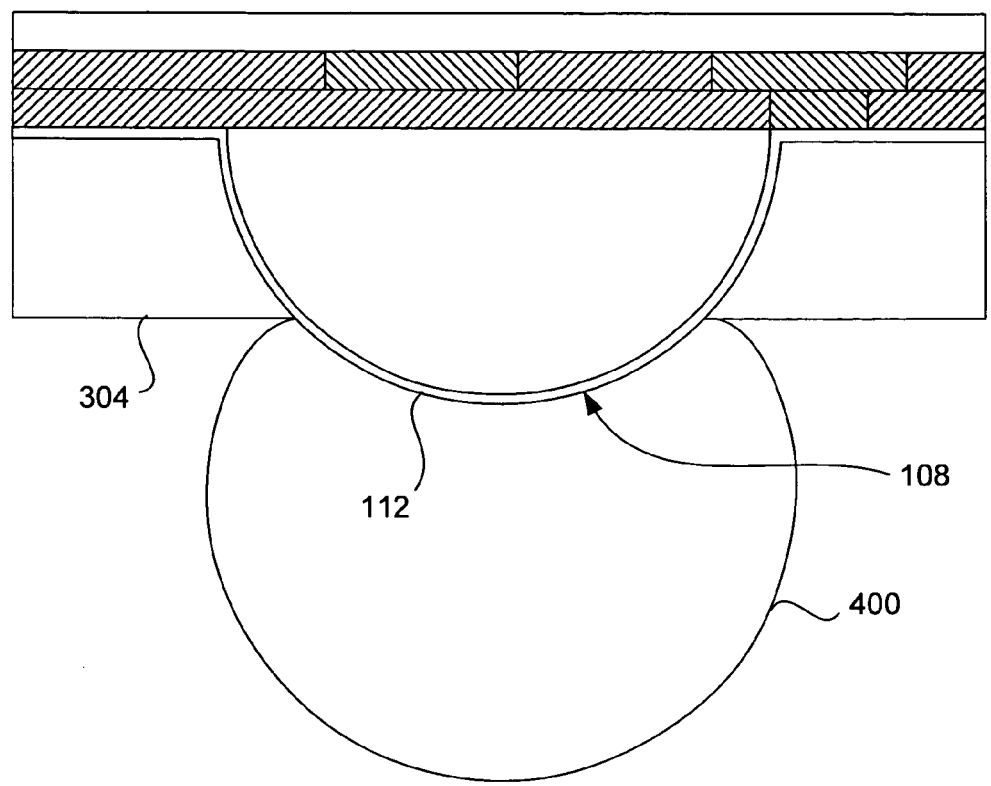
FIG. 5A illustrates the application of a solder ball to a metal feed-through structure that has been constructed in accordance with an embodiment of the invention.

The fabrication of feed-through structures 108 is typically accomplished during step 300, while the silicon removal operation is performed during step 320. Step 330 is then performed, i.e., once silicon removal is completed and the conductive layer 112 is exposed on the lower surface 304 of a wafer 200, the feed-through structures 108 are prepared for electrical connection to other components. FIG. 5A illustrates such preparation, where a solder ball 400 or other electrical connector is applied to each feed-through structure 108 according to known ball placement and reflow techniques.

Figure 5B:
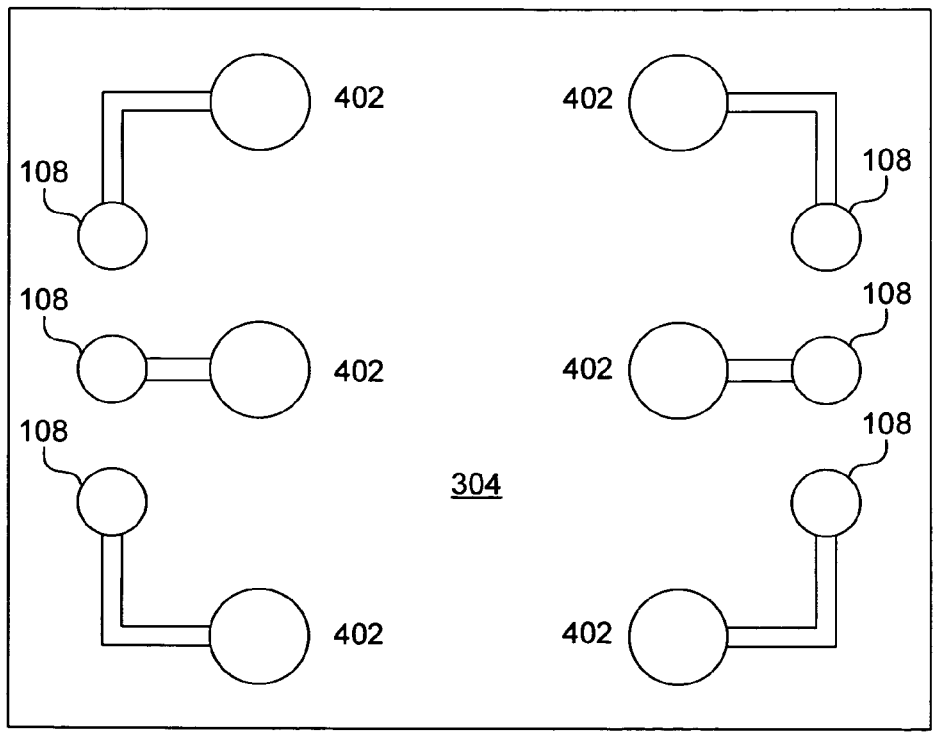
FIG. 5B illustrates the redistribution of electrical connectors in accordance with an embodiment of the invention.

As mentioned previously, solder balls 400 need not always be placed directly on feed-through structures 108. As illustrated in FIG. 5B, solder balls 400 or other electrical connectors can be redistributed to configurations or arrays that allow for more convenient electrical connection to packages or other components. Thus, even when design constraints require feed-through structures 108 to be placed in specific locations on the bottom surface 304, electrical leads can be placed on the bottom surface 304 to UBM pads 402. Known methods allow these leads and UBM pads 402 to be placed in arbitrary locations on the bottom surface 304, allowing for UBM pads 402 and subsequent metallization to be placed in locations convenient for electrical connection.

The foregoing description, for purposes of explanation, uses specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. Obviously many modifications and variations are possible in view of the above teachings. For instance, it has been emphasized above that the invention includes many different configurations of feed-through structures. In addition, the invention includes feed-through structures that can be distributed at any location on the lower surface of a die, and that can also be redistributed in any fashion. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of fabricating an opto-electronic device, comprising:
   creating a hole in the first surface of a semiconductor die;
   depositing a conductive material within the hole;
   electrically coupling the conductive material to a photonic device located on said first surface;
   forming a support feature on the conductive material in the hole:
   processing a second surface of the semiconductor die so as to expose the conductive material on said second surface, wherein the second surface opposes the first surface; and
   attaching an optically transparent laminate on the first surface so as to overlay the photonic device wherein creating a hole in the first surface of a semiconductor die includes forming a hole having a spherically contoured sidewall.

2. A method of fabricating an opto-electronic device, comprising:
   providing a semiconductor substrate having a front side and a back side of the substrate and having side edges;
   forming a photonic device on the front side of the substrate;
   creating a depression in the front side of the substrate away from the edges;
   forming a conductive layer on the front side of the substrate so the layer extends into the depression and enables electrical connection with the photonic device;
   forming a support feature in the depression and on a top side of the conductive layer in the depression;
   electrically coupling the conductive material to the photonic device located on said front side;
   treating the back side of the substrate to remove a portion of the substrate and expose a bottom side of the conductive layer on the treated back side; and
   attaching an optically transparent laminate on the front side to overlay the photonic device.

3. The method of claim 2 further comprising placing an under bump metallization pad proximate to the back side, wherein the under bump metallization pad is electrically connected to the conductive material.

4. The method of claim 3 wherein said placing further includes redistributing the under bump metallization pad at a different location on the back side than the conductive material.

5. The method of claim 2 further comprising placing a solder bump proximate to the conductive material and extending beyond the back side.

6. The method of claim 2 wherein the support feature is formed with a dielectric material.

7. The method of claim 2 wherein treating the back side of the substrate comprises back grinding to remove material and expose the conductive layer.

8. A method of fabricating a plurality of opto-electronic devices on a wafer substrate, comprising:
   creating a plurality of depressions in a front side surface of a substrate;
   depositing conductive material within the depressions;
   electrically coupling the conductive material to an associated plurality of photonic devices located on said front side surface of the substrate;
   forming a plurality of support features on the conductive material in the respective plurality of depressions:
   processing a back side surface of the substrate to expose the conductive material in the depressions at the back side surface of the substrate to form a plurality of backside contacts; and
   attaching an optically transparent laminate on the front side surface of the substrate to overlay each of the photonic devices.

9. The method of claim 8 wherein said processing includes etching the back side surface of the substrate so as to expose the conductive material.

10. The method of claim 8 wherein said processing includes back grinding the back side surface of the substrate so as to expose the conductive material.

11. The method of claim 8 wherein said creating includes etching the plurality of depressions in the front side surface of the substrate.

12. The method of claim 8 wherein said creating includes drilling the plurality of depressions in the front side surface of the die.

13. The method of claim 8 wherein the substrate includes a multiplicity of semiconductor dice, each semiconductor die having edge portions; and
   wherein the plurality of depressions are created away from the edge portions.

14. The method of claim 8 wherein the plurality of photonic devices are image sensors.

15. The method of claim 8 further includes forming a bond pad on the front side surface in electrical connection with a portion of the conductive material.

16. The method of claim 8 wherein forming the plurality of support features on the conductive material in the respective plurality of depressions comprises forming the plurality of features with dielectric material.

17. The method of claim 8 wherein the substrate is singulated to form a plurality of dice having opto-electronic devices formed thereon.

18. The method of claim 8 further including forming a plurality of support features on the conductive material deposited in the depressions.

19. The method of claim 8 further comprising placing a plurality of under bump metallization pads on the backside surface wherein each under bump metallization pad is electrically connected with the conductive material of an associated one of the plurality of backside contacts.

20. The method of claim 19 wherein said placing further includes redistributing the under bump metallization pads at different locations on the backside surface other than the locations of the backside contacts.

21. The method of claim 8 further comprising placing a plurality of solder bumps on the backside surface wherein each solder bump is located on the backside surface and proximate to an associated backside contact and electrically connected with the associated backside contact.

\* \* \* \* \*